(12) United States Patent
Seo et al.

(10) Patent No.: US 6,490,211 B2
(45) Date of Patent: Dec. 3, 2002

(54) RANDOM ACCESS MEMORY DEVICE

(75) Inventors: Dong-Il Seo, Yongin (KR); Gi-Hong Kim, Goyang (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/038,014

(22) Filed: Jan. 2, 2002

(65) Prior Publication Data

US 2002/0057613 A1 May 16, 2002

Related U.S. Application Data

(62) Division of application No. 09/612,169, filed on Jul. 8, 2000, now Pat. No. 6,337,823.

(30) Foreign Application Priority Data

Aug. 12, 1999 (KR) .............................................. 99-33138

(51) Int. Cl.[7] ................................................ G11C 7/00
(52) U.S. Cl. ...................................... 365/205; 365/207
(58) Field of Search ................................ 365/205, 207, 365/208, 189.09, 189.11

(56) References Cited

U.S. PATENT DOCUMENTS

| | | | | |
|---|---|---|---|---|
| 4,958,325 A | * | 9/1990 | Nakagome et al. | 365/206 |
| 5,027,324 A | | 6/1991 | Seo | 365/205 |
| 5,491,435 A | | 2/1996 | Mun et al. | 327/55 |
| 5,544,110 A | | 8/1996 | Yuh | 365/205 |
| 5,638,333 A | | 6/1997 | Lee | 365/205 |
| 5,646,899 A | | 7/1997 | Jang et al. | 365/205 |
| 5,646,900 A | | 7/1997 | Tsukude et al. | 365/205 |
| 5,870,343 A | * | 2/1999 | Chi et al. | 365/149 |
| 6,205,068 B1 | | 3/2001 | Yoon | 365/203 |

* cited by examiner

Primary Examiner—Richard Elms
Assistant Examiner—Anh Phung

(57) ABSTRACT

A dynamic random access memory device includes a circuit for generating sense amplification activation signals applied to sense amplifier circuits. The circuit changes the slopes of the activation signals according to variation of a power supply voltage. According to the present invention, the peak current the sense amplifier circuits use when the power supply voltage increases, is reduced, so that the sense amplifier circuits create less noise in the memory device.

2 Claims, 9 Drawing Sheets

RANDOM ACCESS MEMORY DEVICE

CROSS REFERENCE TO RELATED APPLICATION

This application is a division of and claims priority from U.S. Pat. application Ser. No. 09/612,169, filed Jul. 8, 2000, now U.S. Pat. No. 6,337,823 issued on Jan. 8, 2002, entitled, "Random Access Memory Device Capable of Minimizing Sensing Noise", which claims priority from Korean Patent Application number 99-33138 filed Aug. 12, 1999.

FIELD OF THE INVENTION

The present invention is in the field of semiconductor integrated circuit devices and is more specifically related to a dynamic random access memory device that minimizes noise induced by sense amplifier circuits.

BACKGROUND OF THE INVENTION

FIG. 1 is a block diagram of a conventional dynamic random access memory device. In FIG. 1, each memory cell MC includes an access transistor 10 acting as a switch and a capacitor 12 holding a data bit. Gates of access transistors 10 in the same row i are connected to a common word line WLi (i=1, 2, 3, . . . , m) for the row. Sources of access transistors 10 in a column j are alternately connected to a corresponding pair of bit lines BLj and BLjB (j=1, 2, 3, . . . , n). One of the electrodes of each capacitor 12 is coupled to a drain of a corresponding access transistor 10, and the other electrode thereof is coupled to a plate voltage Vp.

When a row address signal is applied, a row decoder 14 decodes the row address signal and activates a word line corresponding to the decoded row address signal to thereby turn on all access transistors 10 of memory cells MC coupled to the activated word line. Charges representing data, which are stored in all capacitors 12 of the memory cells corresponding to the activated word line, flow to corresponding bit lines via corresponding access transistors 10. Sense amplifier circuits 16 sense and amplify very small voltage difference resulting from charge flowing to corresponding bit lines. Each of the sense amplifier circuits 16 responds to signals LAPG and LANG from a sense amplification activation signal generator 22 and drives a lower voltage on a bit line to a ground voltage VSS and a higher voltage of a bit line to an internal power supply voltage VCCA. An input/output gate circuit 20 transfers the amplified bit line signals to a data output buffer 24.

FIG. 2 is a circuit diagram of the sense amplification activation signal generator 22 illustrated in FIG. 1. This embodiment of the sense amplification activation signal generator 22 includes four inverters INV1, INV2, INV3, and INV4 connected as illustrated in FIG. 2. Herein, the inverters INV2 and INV3 serve as a buffer. The generator 22 provides a sense amplification activation signal LAPG at a high level and a sense amplification activation signal LANG at a low level when a row active command signal (e.g., a word line enable signal) is at a low level. On the other hand, the generator 22 provides the signal LAPG at a low level and the signal LANG at a high level when the row active command signal is at a high level.

FIG. 3 is a circuit diagram showing sense amplifier circuits 16. Each of the sense amplifier circuits 16 is coupled between bit lines of a corresponding pair of bit lines, and is composed of two PMOS transistors MP1 and MP2 and two NMOS transistors MN1 and MN2 connected as illustrated in FIG. 3. First current electrodes of the PMOS transistors MP1 and MP2 in each of the sense amplifiers 16 are commonly coupled to a signal line LA, and first current electrodes of the NMOS transistors MN1 and MN2 are coupled to a signal line LAB. The signal line LA is connected to an internal power supply voltage VCCA via a PMOS transistor MP3, which the sense amplification activation signal LAPG switches. The line LAB is connected to a ground voltage VSS via an NMOS transistor MN3, which the sense amplification activation signal LANG switches.

When a word line is selected, one of the respective bit lines of each pair changes to a voltage lower or higher than a precharge voltage (e.g., VCC/2), while the other bit line remains at the precharge voltage. In each sense amplifier circuit 16, bit line voltages turn on one of the PMOS transistors MP1 and MP2 and one of the NMOS transistors MN1 and MN2. When the sense amplification activation signals LAPG and LANG are activated respectively low and high, the signal lines LA and LAB are coupled to VCCA and VSS through corresponding transistors MP3 and MN3, respectively. Thus each sense amplifier circuit 16 amplifies bit line voltages of a corresponding pair of bit lines BLj and BLjB to voltages VCCA and VSS or voltages VSS and VCCA.

Operating characteristics of a semiconductor integrated circuit or a MOS transistor change as the operating voltage varies. For example, if the operating voltage decreases, an operating speed of the MOS transistor decreases. On the other hand, if the operating voltage increases, the operating speed increases. This is because the carrier (electron or hole) mobility of the MOS transistor increases with operating voltage. For this reason, generator 22 asserts the signals LAPG (HVCC) and LANG (HVCC) faster when the operating voltage (internal power supply or external power supply voltage) is high and asserts signals LAPG (LVCC) and LANG (LVCC) more slowly when the operating voltage is low. FIG. 4 illustrates the timing of signals in the high and low supply voltage cases.

According to the conventional sense amplification activation signal generator 22, when a power supply voltage is high, noise such as power supply voltage bouncing or ground voltage bouncing is higher. Such noise may occur when multiple sense amplifier circuits 16 operate. As an internal power supply voltage (or an external power supply voltage) increases, rise/fall time of the respective signals LAPG and LANG (or the time required to turn on a transistor) becomes shorter. If the rise/fall time becomes shorter, the amount of current instantly supplied through each MOS transistor, i.e., the peak current increases. Because the signals LAPG and LANG simultaneously switch many transistors MP3 and MN3, the peak current may further increase when the transistors MP3 and MN3 simultaneously turned on, resulting in greater noise such as the power supply voltage bouncing and the ground voltage bouncing. This increases noise (referred to as a sensing noise) when sense amplifier circuits 16 operate simultaneously.

The power supply voltage bouncing and the ground voltage bouncing can cause a malfunction in peripheral circuits. In particular, in a dynamic random access memory supporting a bank operation, such bouncing from operation of one bank affects operation of another bank. Accordingly, circuits and methods for minimizing the sensing noise resulting from operation of sense amplifier circuits are sought.

SUMMARY OF THE INVENTION

The embodiments of the present invention provide a random access memory device capable of minimizing sensing noise that causes variation of an operating voltage.

In accordance with the invention, a random access memory device is provided which comprises: a memory cell array for storing data; a plurality of bit line pairs coupled to the memory cell array; and a plurality of sense amplifier circuits coupled to the respective bit line pairs. Each of the sense amplifier circuits senses a voltage difference between bit lines of a corresponding pair and amplifies the sensed voltages either to first and second power supply voltages or to the second and first power supply voltages in response to first and second sense amplification activation signals. A sense amplification activation signal generating circuit generates first and second sense amplification activation signals in response to a row active command signal. The sense amplification activation signal generating circuit includes a voltage comparator, a signal generator, a first delay, and a second delay. The voltage comparator compares a power supply voltage with a reference voltage to generate a comparison signal. The signal generator generates first and second signals in response to the row active command signal. A first delay adjusts rise/fall time of the first signal to output the first signal thus adjusted as the first sense amplification activation signal, depending on a logic level of the comparison signal. A second delay adjusts the rise/fall time of the second signal to output the second signal thus adjusted as the second sense amplification activation signal, depending on a logic level of the comparison signal.

BRIEF DESCRIPTION OF THE DRAWING

In the figures, like reference numerals denote like or corresponding parts.

DESCRIPTION OF THE PREFERRED EMBODIMENT

Figure 1:
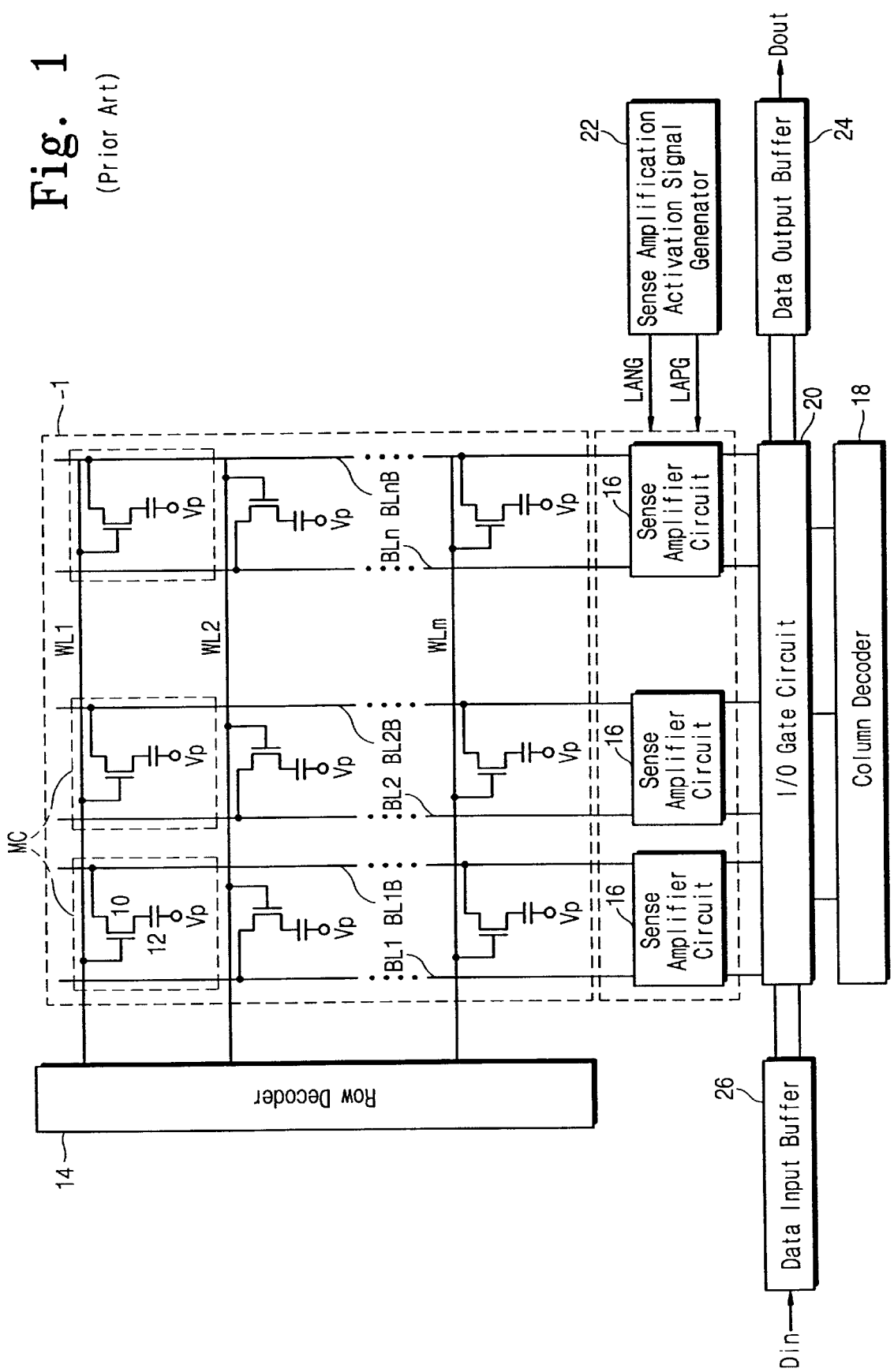
FIG. 1 is a block diagram of a conventional dynamic random access memory device.
Figure 5:
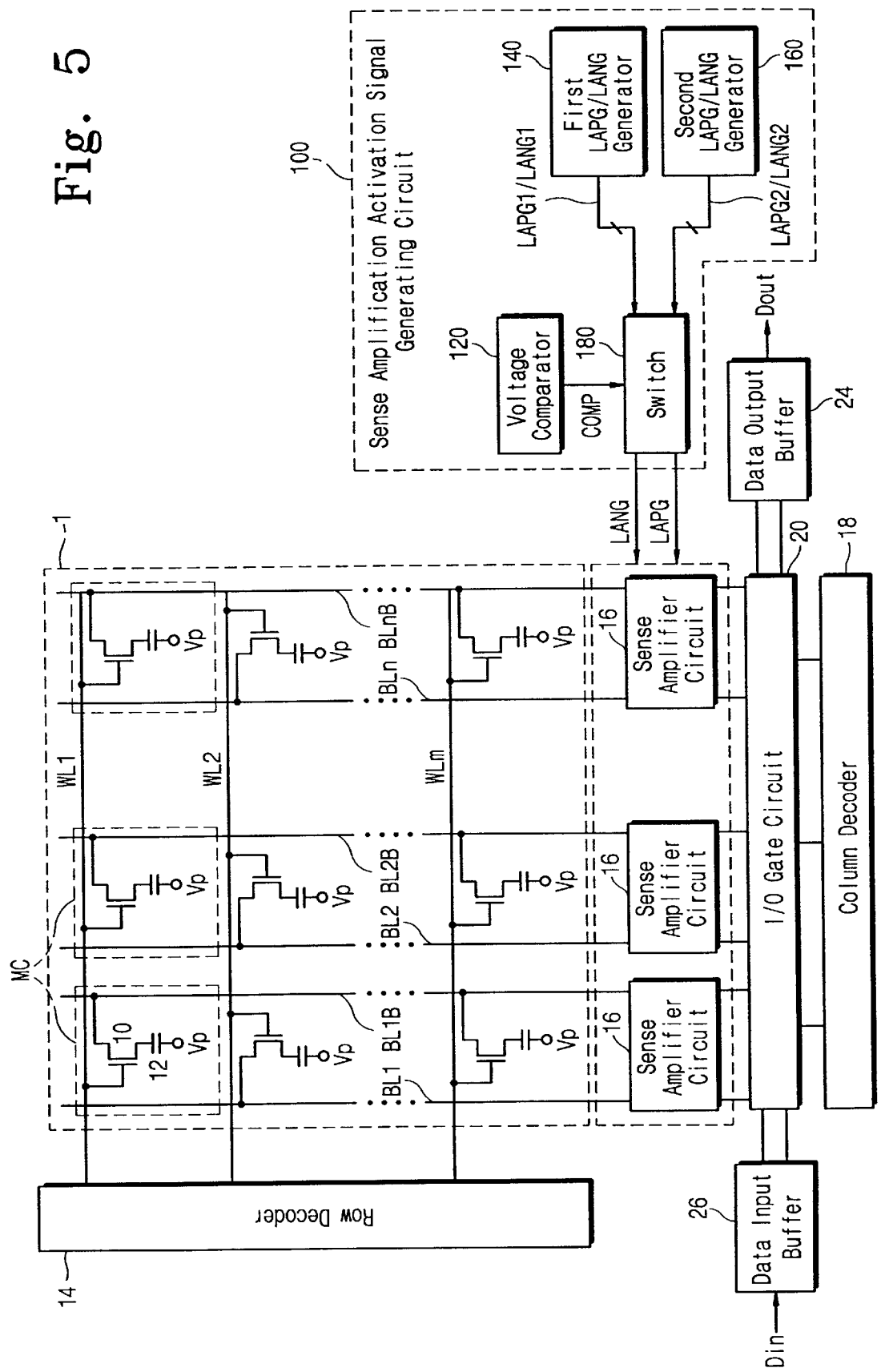
FIG. 5 is a block diagram of a random access memory device according to an embodiment of the present invention.

FIG. 5 shows a dynamic random access memory device according to an embodiment of the present invention. In FIG. 5, the constituent elements that are identical to those in the conventional art of FIG. 1 are labeled with the same reference numerals, and description thereof is omitted.

Referring to FIG. 5, a sense amplification activation signal generating circuit 100 produces sense amplification activation signals LAPG and LANG, which are commonly supplied to sense amplifier circuits 16, in response to a row active command signal. The circuit 100 includes a voltage comparator 120, first and second sense amplification activation signal generators 140 and 160, and a switch 180. The voltage comparator 120 compares a power supply voltage (internal or external power supply voltage) with a predetermined reference voltage to generate a comparison signal COMP. The first signal generator 140 activates first sense amplification activation signals LAPG1 and LANG1 in response to activation of a row active command signal. The second signal generator 160 activates second sense amplification activation signals LAPG2 and LANG2 in response to activation of the row active command signal. Second sense amplification activation signals LAPG2 and LANG2 have a rise/fall time (or a slope) that is longer (or slower) than that of the first signals LAPG1 and LANG1. The switch 180 transfers either the first signals LAPG1 and LANG1 or the second signals LAPG2 and LANG2 as the output signals LAPG and LANG from the circuit 100.

Figure 6:
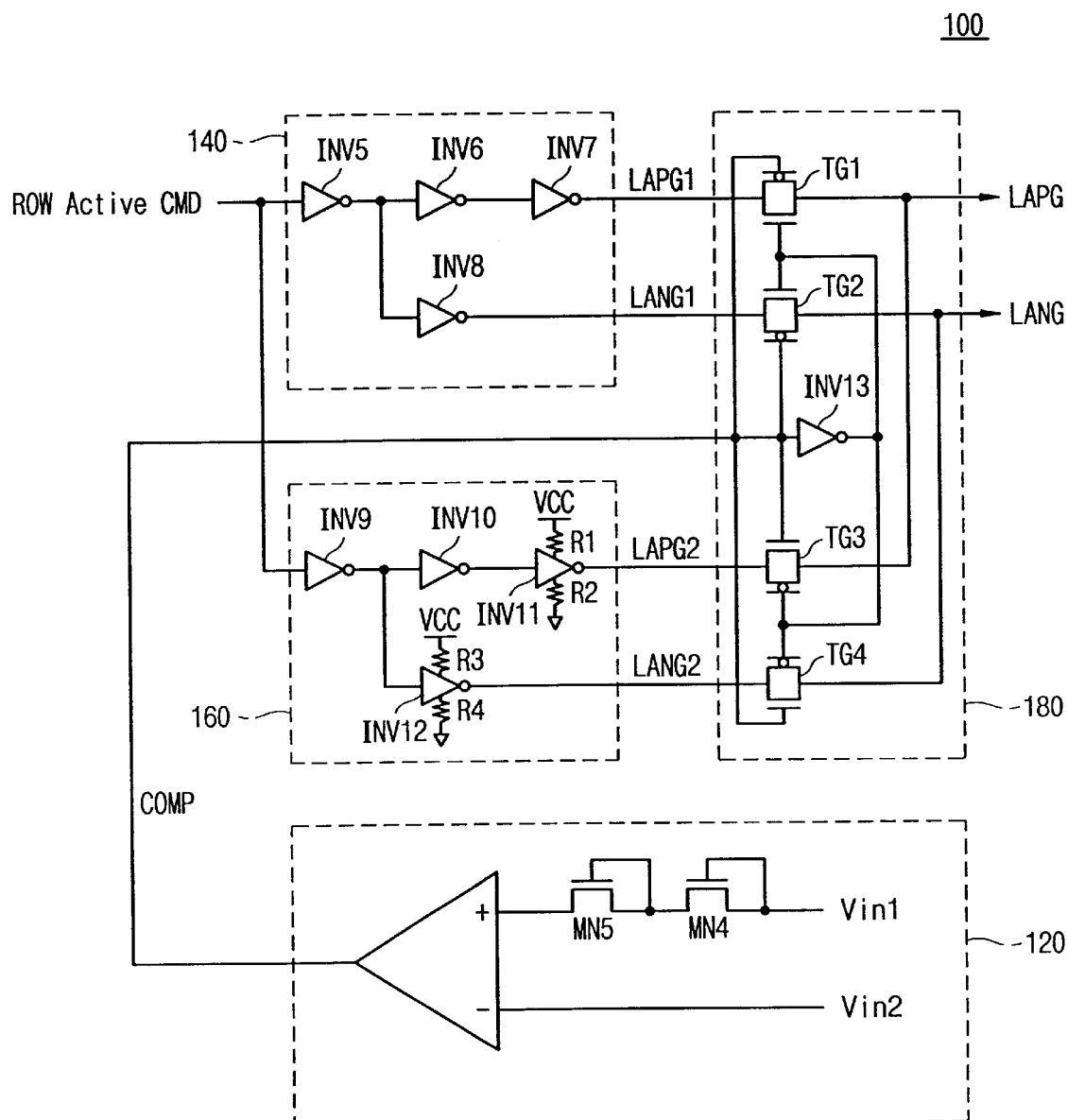
FIG. 6 is circuit diagram of an embodiment of a sense amplification activation signal generating circuit illustrated in FIG. 5.

FIG. 6 is a circuit diagram of an embodiment of the sense amplification activation signal generating circuit 100. Referring to FIG. 6, the voltage comparator 120 compares a first input voltage Vin1 as an operating voltage (an internal or external power supply voltage) with a second input voltage Vin2 as the reference voltage, and generates the comparison signal COMP. In an exemplary embodiment, the first input voltage Vin1 is the operating voltage VDD, which is 3.0±0.3 volts, and the second voltage Vin2 is from an internal voltage generating circuit (not shown) that sets the second input voltage Vin2 to 1.5 volts. More generally, the second input voltage Vin2 depends on the first input voltage Vin1 and the threshold voltages of transistors MN4 and Nn5. The comparator 120 includes a differential amplifier having a positive input terminal (+) receiving the first input voltage Vin1 and a negative input terminal (−) receiving the second input voltage Vin2. With this configuration, the comparator 120 generates the comparison signal COMP at a low level when the first input voltage Vin1 after voltage drops through transistors MN4 and MN5 is lower than the second input voltage Vin2. The comparator 120 generates the comparison signal COMP at a high level when the first input voltage Vin1 after voltage drops through transistors MN4 and MN5 is higher than the second input voltage Vin2.

Figure 2:
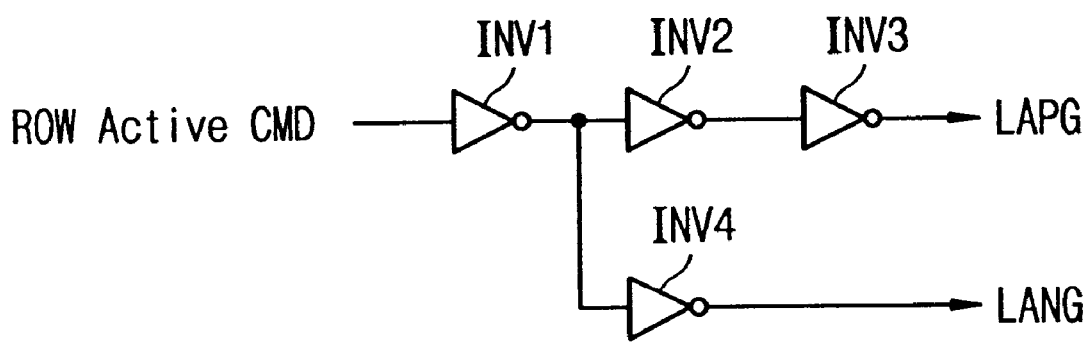
FIG. 2 is a circuit diagram of a sense amplification activation signal generator illustrated in FIG. 1.
Figure 3:
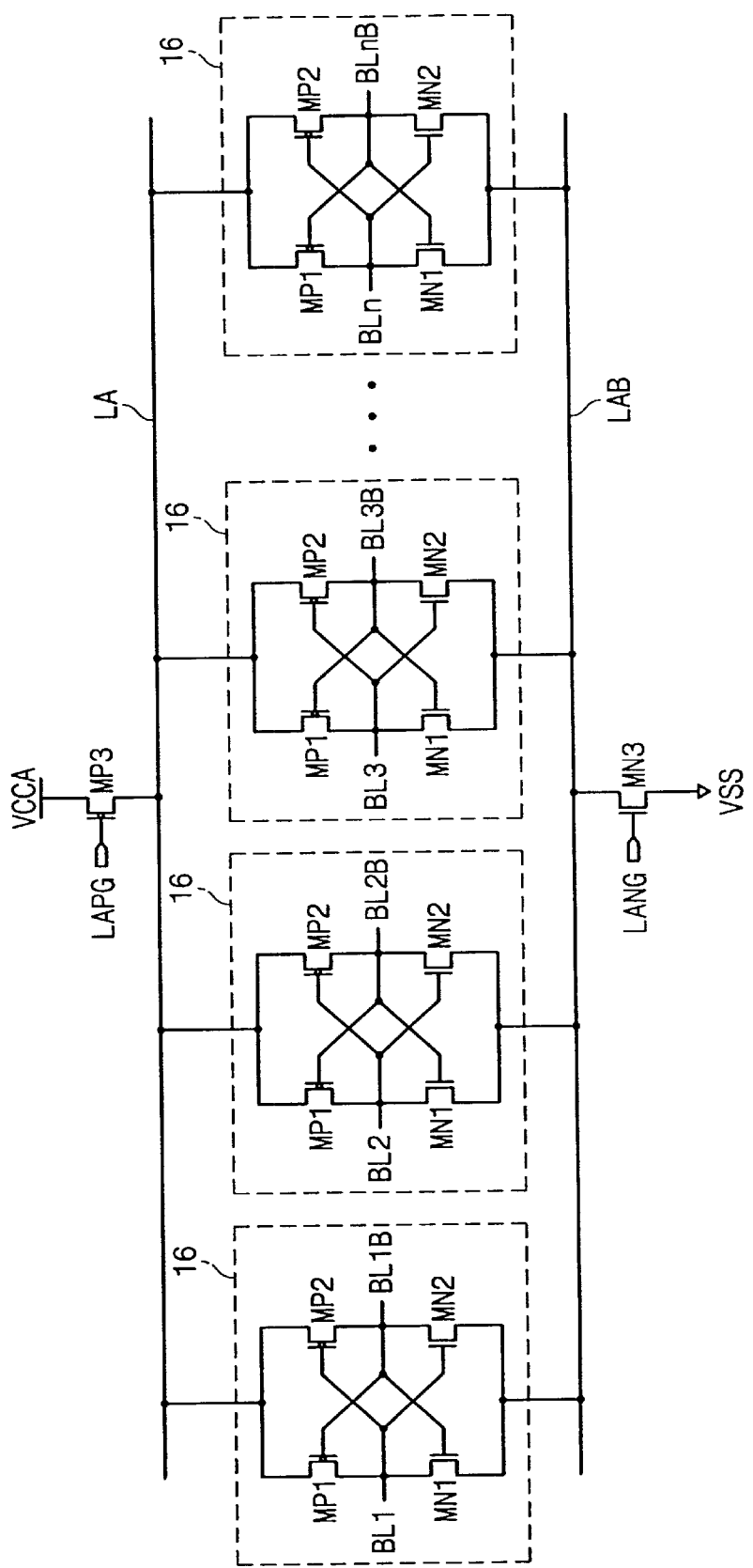
FIG. 3 is a circuit diagram including sense amplifier circuits corresponding to respective bit line pairs illustrated in FIG. 1.

Continuing to refer to FIG. 6, the first sense amplification activation signal generator 140 includes four inverters INV5 to INV8, which have the same sizes and speed as those in FIG. 2. The inverters INV6 and INV7 serve as a buffer. Assuming that a stable power supply voltage is supplied in memory device, the output signals LAPG1 and LANG1 of the generator 140 have the same slopes (referred to herein as "a first slope") or rise/fall time as signals LAPG and LANG in FIG. 2. The second sense amplification activation signal generator 160 includes four inverters INV9 to INV12 and four resistors R1 to R4 connected as illustrated in FIG. 6. The inverters INV10 and INV11 serve as a buffer. In accordance with this configuration, the signals LAPG2 and LANG2 have shallower slopes (referred to herein as "a second slope") than do the signals LAPG1 and LANG1.

The switch 180 includes four transfer gates TG1, TG2, TG3, and TG4 and an inverter INV13 connected as illustrated in FIG. 6. When the comparison signal COMP is low, the transfer gates TG1 and TG2 are enabled, and the transfer gates TG3 and TG4 are disabled. As a result, the switch 180 outputs the signals LAPG1 and LANG1 as the output signals LAPG and LANG of the circuit 100. On the other hand, when the comparison signal COMP is high (i.e., when the power supply voltage after voltage drops through transistors MN4 and MN5 is higher than the reference voltage), the transfer gates TG1 and TG2 are disabled, and the transfer gates TG3 and TG4 are enabled. As a result, the switch 180 outputs the signals LAPG2 and LANG2 as the output signals LAPG and LANG of the circuit 100. Accordingly, the slopes of the output signals LAPG and LANG increase more slowly than do the slopes of signals LAPG1 and LANG1.

The operation of the dynamic random access memory device of FIG. 5 is described below with reference FIGS. 5, 6, and 7.

When the row decoder 14 selects a word line, one bit line from each pair has a voltage changed into a voltage either higher or lower than a precharge voltage (e.g., VCC/2), and the other bit line of the pair remains at the precharge voltage. Depending on bit line voltages thus set, one of the PMOS transistors MP1 and MP2 of each sense amplifier circuit 16 is turned on, and one of the NMOS transistors MN1 and MN2 thereof is turned on. The sense amplification activation signal generating circuit 100 produces the signals LAPG and LANG having either the first slope or the second slope in accordance with the level of the supply voltage, as will be more fully described below.

Figure 4:
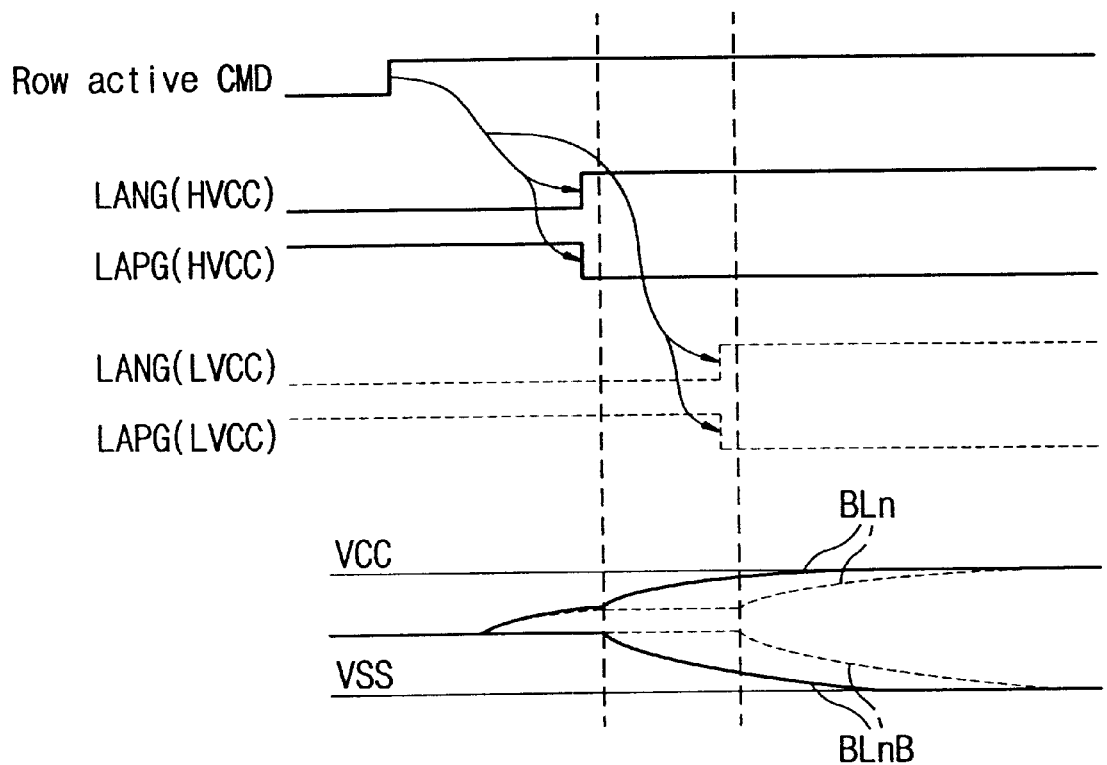
FIG. 4 is a timing diagram showing a relationship between variations of bit line voltage and enable/disable speed of sense amplification activation signals for different power supply voltages in the device of FIG. 1.

First, the first and second sense amplification activation signal generators 140 and 160 produce corresponding signals LAPG1, LANG1, LAPG2 and LANG2 in response to a row active command signal. If the power supply voltage has a higher than the nominal level, the voltage comparator 120 in FIG. 6 generates the comparison signal COMP at a high level. This forces the signals LAPG2 and LANG2 of the second slope (i.e., delayed rise/fall time) to be the output signals LAPG (HVCC) and LANG (HVCC) of the circuit 100. As compared with the signals LAPG and LANG illustrated in FIG. 4, the output signals LAPG and LANG from the circuit 100 have shallower slopes. Thus, although the power supply voltage is higher than a predetermined voltage, the peak current issued at an activation of the sense amplifier circuits 16 is reduced.

Figure 7:
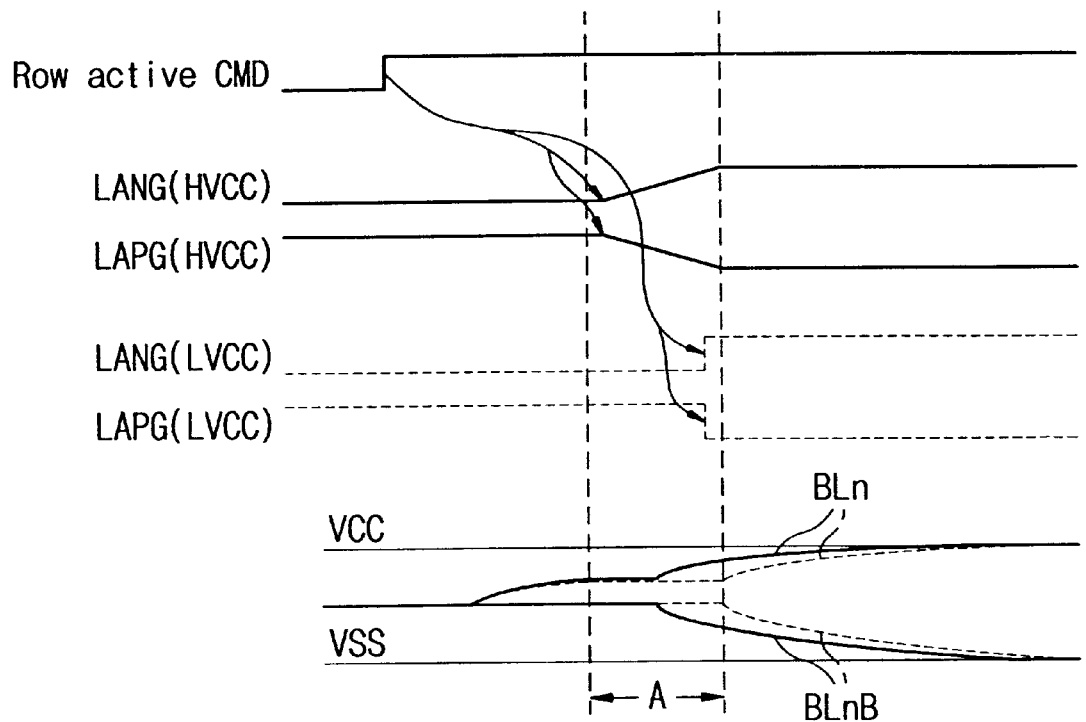
FIG. 7 is a timing diagram showing a relationship between variations of bit line voltage and enable/disable speed of sense amplification activation signals for different power supply voltages in the device of FIG. 5.

When the power supply voltage is lower than the reference voltage, the voltage comparator 120 generates the comparison signal COMP at a low level, and the signals LAPG1 and LANG1 in a period A of FIG. 7 are the output signals LAPG and LANG from the circuit 100. After this, the signal lines LA and LAB commonly coupled to the sense amplifier circuit 16 are respectively coupled to voltages VCCA and VSS through corresponding PMOS and NMOS transistors MP3 and MN3, which the signals LAPG and LANG turn on. The slope of signals LAPG and LANG are determined according to the power supply voltage level. As a result of the aforementioned operation, each sense amplifier circuit 16 amplifies voltages on bit lines of the corresponding pair to voltages VCCA and VSS (or VSS and VCCA), but the peak currents for the operations are reduced to correspondingly reduce noise in the supply voltages.

Figure 8:
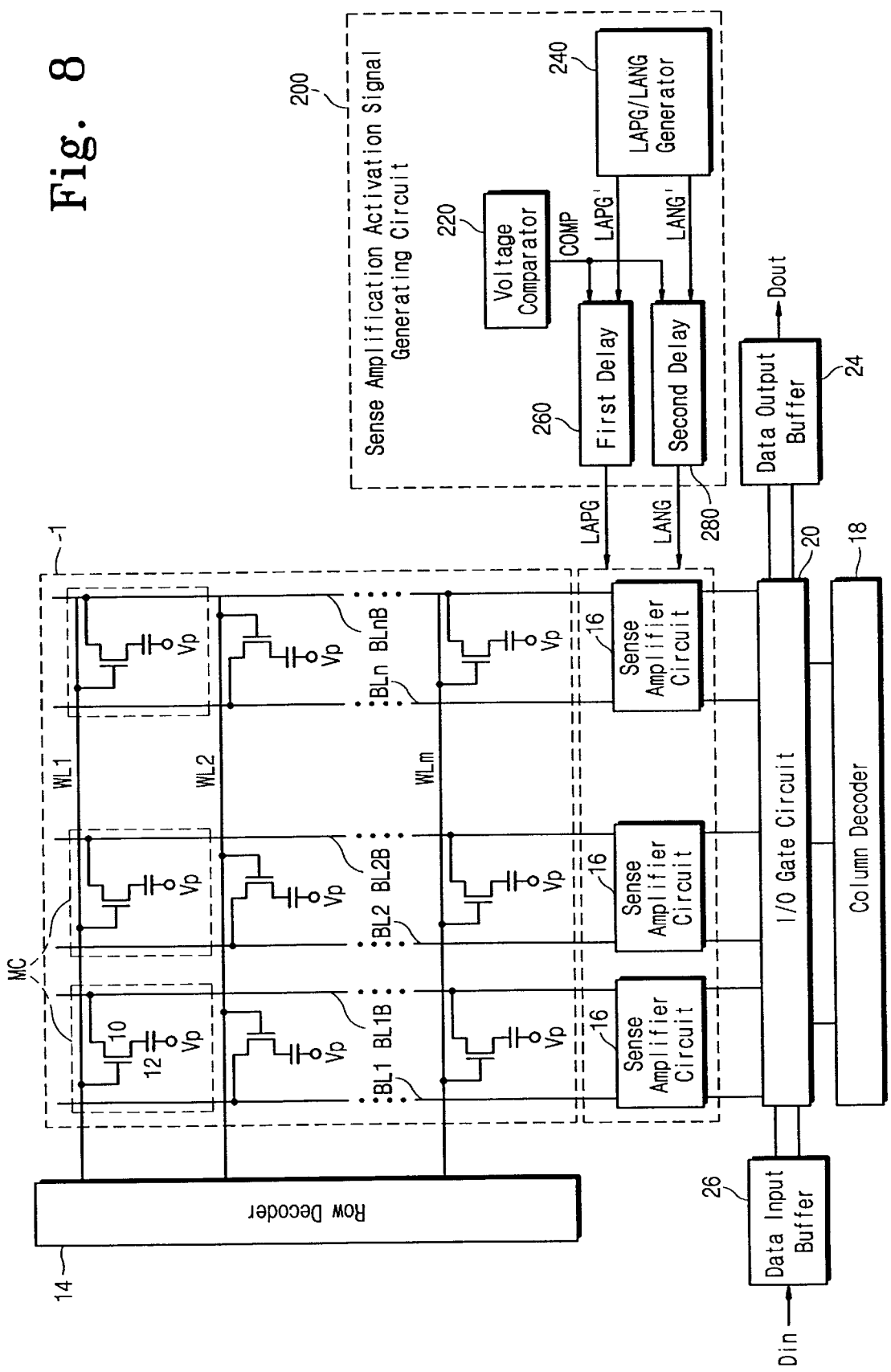
FIG. 8 shows a block diagram of a random access memory device according to another embodiment of the present invention.

FIG. 8 shows a dynamic random access memory (DRAM) device according to another embodiment of the present invention. In FIG. 8, the constituent elements that are identical to those in FIG. 1 are labeled with the same reference numerals, and description thereof is omitted.

Referring to FIG. 8, the sense amplification activation signal generating circuit 200 includes a voltage comparator 220, a sense amplification activation signal generator 240, a first delay 260, and a second delay 280. The voltage comparator 220 compares a power supply voltage (internal or external power supply voltage) with a predetermined reference voltage to generate a comparison signal COMP. The sense amplification activation signal generator 240 produces signals LAPG' and LANG' in response to a row active command signal (e.g., word line enable signal). The first and second delays 260 and 280 adjust the rise/fall time (or slope) of corresponding signals according to a logic level of the comparison signal COMP, as will be more fully described below.

Figure 9:
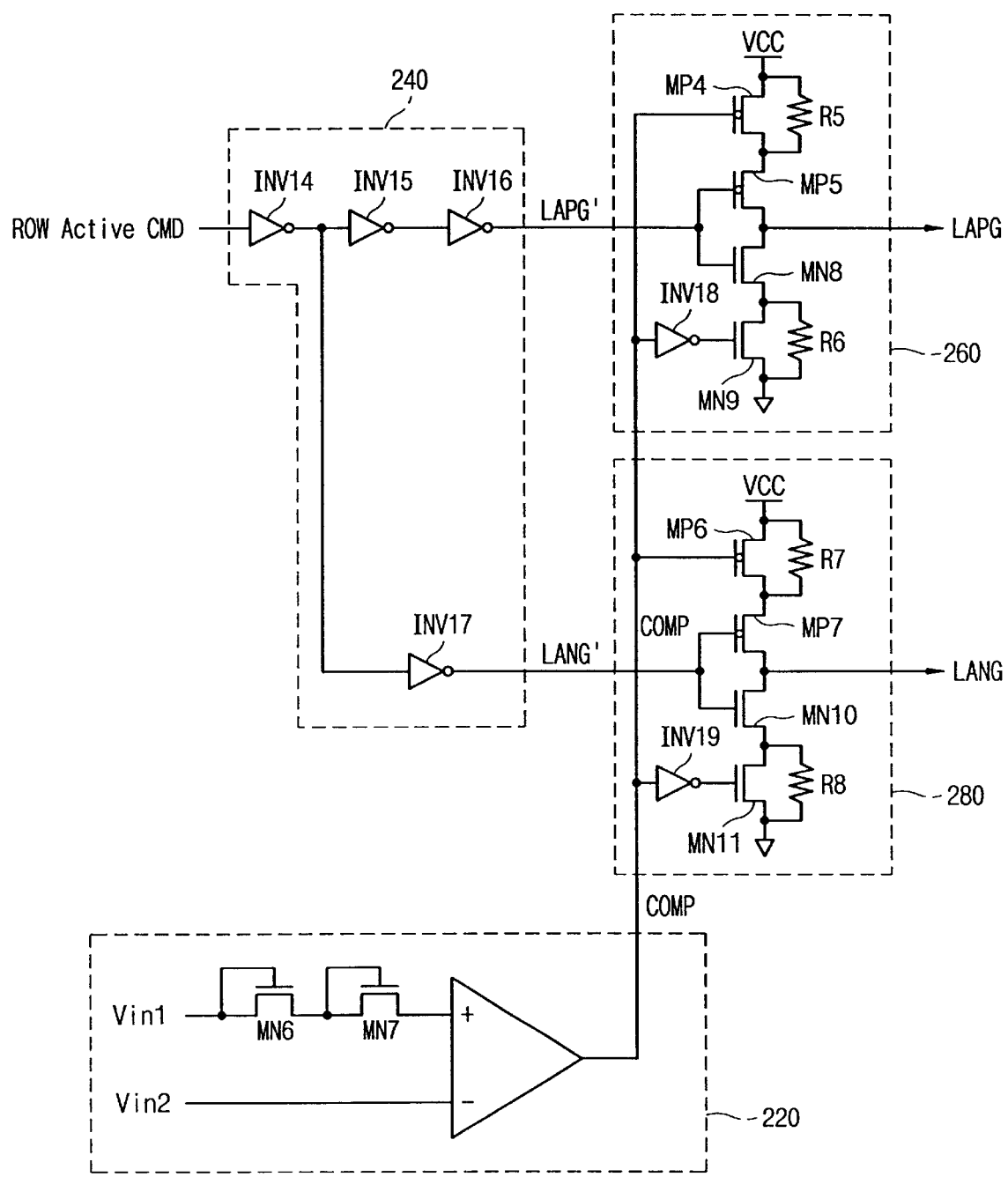
FIG. 9 is circuit diagram of an embodiment of a sense amplification activation signal generating circuit illustrated in FIG. 8.

FIG. 9 is a circuit diagram of an embodiment of the sense amplification activation signal generating circuit 200. Referring to FIG. 9, a voltage comparator 220 compares an internal or external power supply voltage as a first input voltage Vin1 with a predetermined reference voltage as a second input voltage Vin2, and then outputs a comparison signal COMP of either a low level or a high level. The voltage comparator 220 includes a differential amplifier which has a positive input terminal (+) receiving the first input voltage Vin1, which is supplied via diode-connected NMOS transistors MN6 and MN7, and a negative input terminal (−) receiving the second input voltage Vin2. With this configuration, when the first input voltage Vin1 after voltage drops through NMOS transistors MN6 and MN7 is lower than the second input voltage Vin2, the comparator 220 outputs the comparison signal COMP at a low level. When the first input voltage Vin1 (after voltage drops) is higher than the second input voltage Vin2, the comparator 220 outputs the comparison signal COMP at a high level.

As illustrated in FIG. 9, the sense amplification activation signal generator 240 includes four inverters INV14 to INV17, which have the same or similar sizes and speeds as do inverters INV1 to INV4 in FIG. 2. The generator 240 asserts signals LAPG' and LANG' in response to a row active command signal. The signals LAPG' and LANG' have the same slopes (the first slope) as those from the generator in FIG. 2 when a stable power supply voltage at the nominal level is used.

The first delay 260 includes two PMOS transistors MP4 and MP5, two NMOS transistors MN8 and MN9, two resistors R5 and R6, and an inverter INV18 connected as illustrated in FIG. 9. Similarly, the second delay 280 includes two PMOS transistors MP6 and MP7, two NMOS transistors MN10 and MN11, two resistors R7 and R8, and an inverter INV19 connected as illustrated in FIG. 9. With this configuration, when the comparison signal COMP is at a low level, the PMOS and NMOS transistors MP4 and MN9 of the first delay 260 and the PMOS and NMOS transistors MN6 and MN11 of the second delay 280 are turned on. Thus, the slopes (or rise/fall time) of the signals LAPG' and LANG' are not changed. This means that the signals LAPG' and LANG' have the first slope, respectively. On the other hand, when the comparison signal COMP is at a high level, the PMOS and NMOS transistors MP4 and MN9 of the first delay 260 and the PMOS and NMOS transistors MN6 and MN11 of the second delay 280 are off. Thus, the slopes (or rise/fall time) of the signals LAPG' and LANG' become slower (this means that the signals LAPG' and LANG' have the second slope). As a result, although the power supply voltage increases, the peak current, which occurs when plural sense amplifier circuits 16 are simultaneously activated, can be minimized.

The operation of the dynamic random access memory device according to the second embodiment will be more fully described with reference to the accompanying drawings.

When a word line is selected by the row decoder 14, one of the bit lines of each pair changes to a voltage higher than the precharge voltage (e.g., VCC/2), while the other thereof remains at the precharge voltage. One of the PMOS transistors MP1 and MP2 and one of the NMOS transistors MN1 and MN2 of each sense amplifier circuit 16 turns on according to the bit line voltages. The sense amplification activation signal generating circuit 200 generates the sense amplification activation signals LAPG and LANG of either the first slope or the second slope according to the power supply voltage level (external or internal power supply voltage level), as will be more fully described below.

First, the sense amplification activation signal generator 240 yields the signals LAPG' and LANG' in response to a row active command signal. If the power supply voltage is higher than the nominal voltage, the voltage comparator 220 of FIG. 9 generates the comparison signal COMP of a high level. This turns off the PMOS and NMOS transistors MP4 and MN9 of the first delay 240 and the PMOS transistor and NMOS transistors MP6 and MN11 of the second delay 260. With transistors MP4, MN9, MP6, and MN11 off, the resistors R5 and R6 in the delay 260 and the resistors R7 and R8 in the delay 280 restrict currents in delays 260 and 280. Thus, slopes of the signals LAPG and LANG output from delays 260 and 280 are shallower than those of the signals LAPG' and LANG'.

If the power supply voltage is lower than the reference voltage, the voltage comparator 220 generates the comparison signal COMP of a low level. This turns on the PMOS and NMOS transistors MP4 and MN9 of the first delay 240 and the PMOS transistor and NMOS transistors MP6 and MN11 of the second delay 260. As a result, delays 260 and 280 have fast responses, and the slopes of signals LAPG and LANG are the same as the slopes of the signals LAPG' and LANG'. The slopes of signals LAPG and LANG control the speed of the connection of the signal lines LA and LAB commonly coupled to the sense amplifier circuits 16 to voltages VCCA and VSS via the PMOS and NMOS transistors MP3 and MN3. As a result, voltages of the bit lines BLn and BLnB of each pair are amplified to voltages VCCA and VSS (or VSS and VCCA) by corresponding sense amplifier circuits 16, but the peak current is limited to reduce noise in the supply voltage.

The invention has been described using exemplary embodiments. However, it is to be understood that the scope of the invention is not limited to the disclosed embodiments. On the contrary, various modifications and similar arrangements are possible. The scope of the claims, therefore, should be accorded the broadest interpretation so as to encompass all such modifications and similar arrangements.

What is claimed is:

1. A random access memory device comprising:
    a memory cell array for storing data;
    a plurality of bit line pairs coupled to the memory cell array;
    a plurality of sense amplifier circuits coupled to correspond to the respective bit line pairs, wherein each of the sense amplifier circuits senses a voltage difference between bit lines of a corresponding pair and amplifies the voltage difference in response to first and second sense amplification activation signals; and
    a sense amplification activation signal generating circuit that generates the first and second sense amplification activation signals in response to a row active command signal,
    wherein the sense amplification activation signal generating circuit includes:
        a voltage comparator that compares a power supply voltage with a reference voltage to generate a comparison signal;
        a signal generator that generates first and second signals in response to the row active command signal;
        a first delay that adjusts rise/fall time of the first signal according to a logic level of the comparison signal, to output the first signal thus adjusted as the first sense amplification activation signal; and
        a second delay that adjusts rise/fall time of the second signal according to the logic level of the comparison signal to output the second signal thus adjusted as the second sense amplification activation signal.

2. The random access memory device according to claim 1, wherein each of the sense amplifier circuits senses voltages on the bit lines of the corresponding pair and amplifies the sensed voltages of the bit lines of the corresponding pair either to first and second voltages or to the second and first voltages in response to first and second sense amplification activation signals, the first voltage being a voltage dedicated to the memory cell array, the second power supply voltage being a ground voltage, and the power supply voltage being one of an external power supply voltage and an internal power supply voltage.

* * * * *